United States Patent [19]
Reinhardt

[11] Patent Number: 5,290,399
[45] Date of Patent: Mar. 1, 1994

[54] SURFACE PLANARIZING METHODS FOR INTEGRATED CIRCUIT DEVICES

[75] Inventor: Karen Reinhardt, Austin, Tex.

[73] Assignee: Advanced Micro Devices, Inc., Sunnyvale, Calif.

[21] Appl. No.: 650,625

[22] Filed: Feb. 5, 1991

[51] Int. Cl.$^5$ .......................................... H01L 21/00
[52] U.S. Cl. .................... 156/655; 156/656; 156/657; 437/190; 437/195; 437/228
[58] Field of Search ............... 156/655, 656, 657, 643, 156/646; 437/190, 195, 228, 235, 238, 231

[56] References Cited

U.S. PATENT DOCUMENTS

| | | | |
|---|---|---|---|
| 4,614,021 | 9/1986 | Hulseweh | 156/643 X |
| 4,676,867 | 6/1987 | Elkins et al. | 156/643 |
| 4,721,548 | 1/1988 | Morimoto | 437/235 X |
| 4,746,629 | 5/1988 | Hanagasaki | 437/228 X |
| 4,826,709 | 5/1989 | Ryan et al. | 437/231 X |
| 4,894,351 | 1/1990 | Batty | 437/231 X |
| 4,948,459 | 8/1990 | van Laarhoven et al. | 156/643 |
| 4,962,063 | 10/1990 | Maydan et al. | 437/228 |
| 4,983,546 | 1/1991 | Hyun et al. | 437/231 |
| 4,986,878 | 1/1991 | Malazgirt et al. | 437/231 X |
| 5,003,062 | 3/1991 | Yen | 437/231 |
| 5,059,448 | 10/1991 | Chandra et al. | 437/238 X |

FOREIGN PATENT DOCUMENTS

| | | |
|---|---|---|
| 0071204 | 2/1983 | European Pat. Off. |
| 2173822A | 10/1986 | United Kingdom |
| 2191338A | 12/1987 | United Kingdom |

OTHER PUBLICATIONS

A Planarization Process for Double Metal CMOS Using Spin-On-Glass as a Sacrificial Layer, Elkins Reinhardt and Tang, 1986, V-Mic Conf.
"Interlevel Dielectric Planarization with Spin-On Glass Films," Vines and Gupta, 1986, V-Mic Conf.
"Spin-On-Glass Dielectric Planarization for Double Metal CMOS Technology," Chu, Multani, Mittal, Orton and Jecmen, 1986, V-Mic Conf.
"Understanding of Spin-On-Glass (SOG) Properties from Their Molecular Structure," Chiang and Fraser, 1989, V Mic Conf.
"Characterization of Spin-On-Glass Using Fourier Transform Infrared Spectroscopy," Woo, Cain and Lee, Electrochem. Soc., vol. 137, No. 1, Jan. 1990.
"$O_2$ Plasma-Converted Spin-On-Glass for Planarization," Butherus, Hou, Mogab and Schonhorn; J. Vac. Sci. Technol. B3(5), Sep./Oct. 1985.
"Advantages of Using Spin-On-Glass Layer in Interconnection Dielectric Planarization", Schiltz; Microelectronic Engineering 5 (1986) 413–421.
"Application of Surface Reformed Thick Spin-On-Glass to MOS Device Planarization", Ito and Homma; Electrochem Soc., vol. 137, No. 4, Apr. 1990.

*Primary Examiner*—Thi Dang
*Attorney, Agent, or Firm*—Roger L. Maxwell; H. Dale Langley, Jr.

[57] ABSTRACT

An improved method of planarizing a side surface of a partially completed integrated circuit device comprises, in sequence, the steps of depositing on the side surface a spin-on glass coating; partially curing the coating; back etching the coating to remove portions thereof which overlie insulation-encapsulated electrically conductive portions of the device; and then subjecting the remaining coating portions, which are disposed within and level off previously depressed portions of the side surface, to an oxygen plasma final curing process, preferably utilizing a downstream stripper type oxygen plasma generator. By performing the back etching step prior to the oxygen plasma curing step, undesirable cracking of the remaining coating portions is advantageously avoided.

7 Claims, 2 Drawing Sheets

SURFACE PLANARIZING METHODS FOR INTEGRATED CIRCUIT DEVICES

BACKGROUND OF THE INVENTION

The present invention relates generally to the manufacture of integrated circuit devices and, in a preferred embodiment thereof, more particularly relates to surface planarization techniques used in conjunction with such manufacture.

The manufacture of integrated circuit devices is basically a layering process in which successively applied insulative coatings are used to encapsulate and separate two or more "tiers" of metal electrical interconnect structures which are conductively joined at selected locations thereon to collectively define the overall electronic circuitry of the device. Each tier of metal interconnect structures is typically adhered to, and follows the contour of, an outer side surface of a coating (usually an insulative coating) which overlies the previously applied interconnect tier.

Due to the nonplanar topography of each interconnect tier, the outer side surface of the insulative coating directly overlying and contacting the tier has a highly irregular contour normally defined by a spaced apart series of relatively deep depressions positioned adjacent relatively flat, higher topography sections of the coating surface which are positioned over relatively thick components of the underlying interconnect tier. These deep surface depressions are highly undesirable since, if left as they are, they would create sharp bends in the subsequently added metal interconnect portions which are ultimately positioned over the depressions. Accordingly, it is now a common practice in the manufacture of integrated circuit devices to "planarize" the coating surface in which these deep depressions exist prior to continuing the insulation/conductor layering process needed to complete the overall device.

Such surface planarization, which functions to generally fill in and level off the coating surface depressions, is conventionally carried out in a variety of manners utilizing a siloxane based spin-on glass (SOG) material as a filler. For example, one previously proposed surface planarization method entails the steps of depositing over the entire insulative coating surface an SOG coating which is then hot plate baked and nitrogen furnace cured before being back etched to remove essentially all of the SOG coating except those portions disposed within and filling the previously existing surface depressions.

This surface planarization method is undesirable for various reasons. For example, the hot plate bake/nitrogen furnace curing process is not sufficient to essentially completely convert the siloxane structure of the SOG to a desirable silicate, quartz-like structure. Additionally, such pouring process often leaves a portion of the solvents used to manufacture the SOG material in place within the surface depressions. This remaining solvent tends to corrosively attack metal interconnect structures contacting the portions of the SOG coating remaining after etch back. Moreover, the incomplete curing of the SOG coating undesirably reduces its adherence to coatings subsequently applied thereon.

In an attempt to solve these problems, a final curing process, utilizing oxygen plasma, has relatively recently been proposed and has been incorporated in the previously described surface planarization method after the nitrogen furnace cure and before the SOG etch back. While this addition of oxygen plasma final curing of the SOG coating tends to solve the aforementioned problems, it creates one of its own-namely, the creation of relatively large cracks in the portions of the SOG coating remaining in the surface depressions after etch back. This SOG crackage undesirably results in a high rejection rate for the finished devices.

One recently proposed surface planarization method which tends to avoid this SOG cracking includes the step of utilizing highly specialized equipment to initially deposit SOG only into the coating surface depressions, thereby eliminating the need for SOG coating etch back. Under this method the initially deposited "pockets" of SOG filling the previously existing surface depressions are sequentially subjected to a hot plate baking process and a final oxygen plasma cure. This surface planarization process, while producing satisfactory end results, is inordinately expensive (due to the specialized SOG curing equipment required) and is thus not commercially feasible.

From the foregoing it can readily be seen that a need exists for an improved, commercially feasible surface planarization method for use in the manufacture of integrated circuit devices. It is accordingly an object of the present invention to provide such a method.

SUMMARY OF THE INVENTION

In carrying out principles of the present invention in accordance with a preferred embodiment thereof, an insulative coating side surface of a partially completed integrated circuit device is planarized utilizing a uniquely sequenced series of steps including a spin-on glass deposition step, a back etching step, and an oxygen plasma final curing step.

The partially completed integrated circuit device has an insulative coating outer side surface with a spaced apart series of undesirably depressed first sections, forming external "valleys" on the partially completed device, and a series of second sections which overlie insulation-encapsulated, electrically conductive portions of the device. To planarize or "smooth out" this undesirably irregular side surface, a spin-on glass coating is deposited thereon in a conventional manner, the deposited glass coating covering the first and second sections of the side surface to be planarized and generally filling in and leveling off the aforementioned valleys.

The deposited glass coating is then partially cured, preferably by the conventional steps of hot plate baking the coating and then nitrogen furnace curing the baked coating. Using conventional oxygen plasma curing/back etching planarization techniques, the next step would normally be to final cure the coating by heating the coating while subjecting it to oxygen plasma, followed by the step of back etching the coating to remove the portions thereof previously deposited on the second sections of the side surface. It has been found, however, that these latter two steps often create highly undesirable cracking of the glass coating portions remaining after the back etching step.

According to an important feature of the present invention, however, this cracking of the remaining glass coating portions is uniquely avoided by reversing the sequence of the final curing and back etching steps. Specifically, in the surface planarization method of the present invention, the partially cured glass coating is back etched prior to being subjected to an oxygen plasma final curing process which is preferably carried out utilizing a downstream stripper type oxygen plasma generator.

This novel surface planarization process step reversal of the present invention is quite easy to incorporate in the overall manufacture of integrated circuit devices and provides for a substantial reduction in the rejection rate thereof. After the aforementioned side surface of the partially completed device is planarized by this improved method, subsequent conventional construction steps may be carried out such as depositing a second insulative coating on the now-planarized side surface, positioning electrically conductive circuitry on the second insulative coating, operatively connecting selected portions of the circuitry to the underlying, insulation-encapsulated electrically conductive portions of the device, and coating the circuitry with an insulative material.

DETAILED DESCRIPTION

Figure 5:
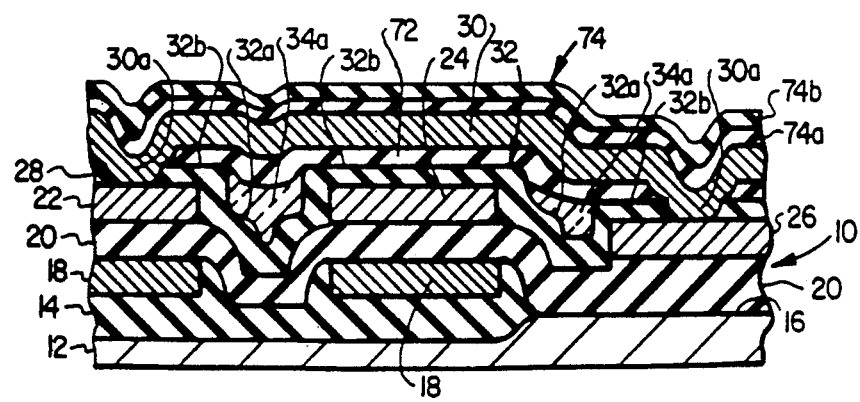

As sequentially illustrated in FIGS. 1-4, the present invention provides an improved surface planarization method used in the manufacture of the representative integrated circuit device 10 shown in FIG. 5. The substructures $10_a$, $10_b$; $10_c$ and $10_d$ respectively shown in FIGS. 1, 2, 3 and 4 sequentially depict the device 10 in various partially completed stages thereof. As will be readily appreciated by those skilled in this particular art, the arrangement and types of the various conductive and insulative components cross-sectionally depicted in the FIG. 5 device 10 are merely illustrative of a wide variety of component arrangements and types typically utilized in the manufacture of integrated circuit devices.

Figure 1:
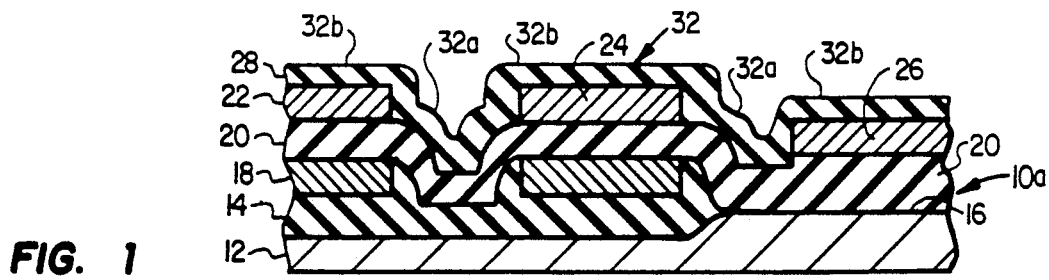
FIGS. 1-5 are enlarged scale partial cross-sectional views through a representative integrated circuit device, in various fabrication stages thereof, and sequentially illustrate the steps used to manufacture the device, including a uniquely sequenced series of surface planarization steps embodying principles of the present invention.

Referring now to FIG. 1, the integrated circuit device substructure $10_a$ has a silicon wafer base 12 upon the top side of which is formed a field oxide layer 14 and an adjacent, much thinner source drain oxide area 16. Polysilicon gate elements 18 are imbedded in the top side of the field oxide layer 14 and are covered by an insulative coating of a boron phosphorous silicate gate material 20 which extends across the source drain oxide area 16. Positioned on the top side of the gate material coating 20 are three representative electrically conductive aluminum alloy interconnect members 22, 24 and 26 which are covered by an insulative coating 28, preferably of a plasma-enhanced chemical vapor deposition oxide (PECVD) as manufactured by the Novellus Corporation and having a thickness of 4-5 kA.

The fabrication of the partially completed portion $10_a$ of the integrated circuit device 10 (FIG. 5) is wholly conventional. The insulation-encapsulated aluminum interconnect members 22, 24 and 26 serve as portions of the overall electronic circuitry incorporated in the finished device 10 and act in conjunction with later-added final interconnect metal circuitry elements 30 which are conventionally connected to selected ones of the interconnect members 22, 24 and 26 as shown in FIG. 5.

As illustrated in FIG. 1, due to the presence of the relatively thick gate elements 18 and the interconnect members 22, 24 and 26 within the built-up insulative portion of the device substructure $10_a$, the outer side surface 32 of the oxide coating 28 is highly irregular, having a series of sharply depressed sections $32_a$ interposed between a series of relatively flat, higher topography sections $32_b$ which overlie the insulation-encapsulated interconnect members 22, 24 and 26.

The abrupt and relatively deep coating surface depressions or "valleys" $32_a$, as is well known, could create problems in the subsequent attachment of the final interconnect elements 30 above the surface 32 if the depressions $32_a$ are left intact. Specifically, undesirable sharp downward bends would be formed in the interconnect elements 30 where they cross over the depressions $32_a$. Accordingly, it is now common practice in the integrated circuit industry to "planarize" the surface 32 in a manner generally filling in and leveling off the undesirable surface depressions $32_a$. As will now be described, the present invention provides substantial improvements in this surface planarization process.

Figure 2:
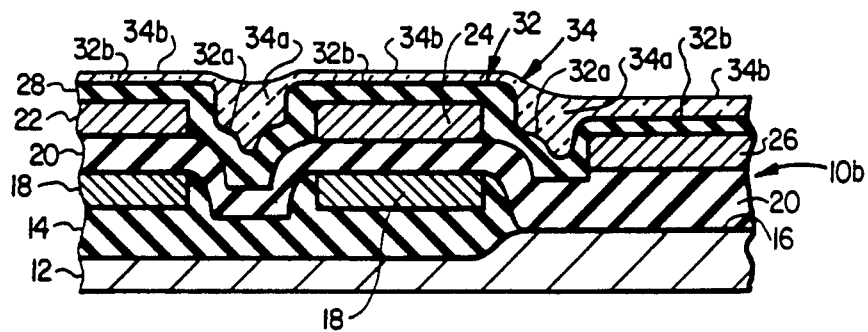

Referring now to FIG. 2, the surface planarization process of the present invention is initiated in a conventional manner by depositing on the coating surface 32 a coating of siloxane based spin-on glass material 34. The formation of the glass coating 34 is preferably achieved using two layers of spin-on glass material such as SOG 105 or 111 as manufactured by the Allied-Signal Corporation. As illustrated in FIG. 2, the deposited SOG coating 34 has relatively thick sections $34_a$ which generally fill and level off the surface depressions $32_a$, and considerably thinner sections $34_b$ which adhere to the generally planar sections $32_b$ of the top surface 32 of the underlying oxide coating 28.

Next, the integrated circuit device substructure $10_b$ is subjected to a conventional hot plate bake process to evaporate the manufacturing solvents in the SOG coating 34, and then cured in a nitrogen oven (at 410° C. or 430° C. depending on the type of SOG used) to partially cure the SOG coating. At this point in a conventional surface planarization process using oxygen plasma as a final curing medium for the SOG coating, the SOG coating 34 would be heated to above 90° C. while being exposed to oxygen plasma to convert the siloxane-based coating 34 to a silicate, quartz-like structure, and then back-etched to remove the relatively thin SOG coating portions $34_b$. It has been found, however, that this conventional sequence of surface planarization steps often results in highly undesirable crackage of the SOG portions $34_a$ (FIG. 3) remaining after the final etch back step. To advantageously avoid this SOG coating crackage problem, the present invention uniquely reverses the final oxygen plasma curing and back etching steps.

Figure 3:
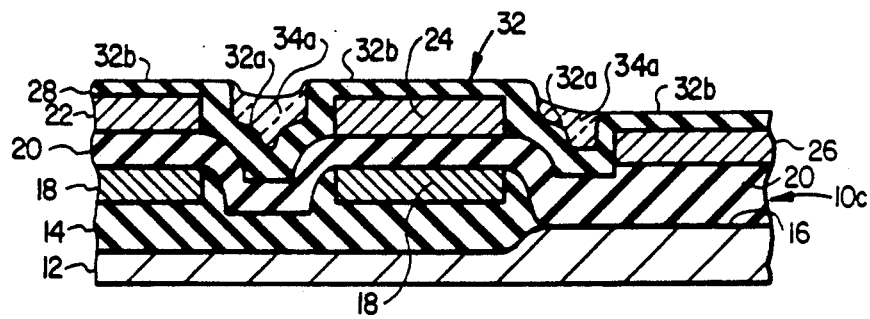
Figure 4:
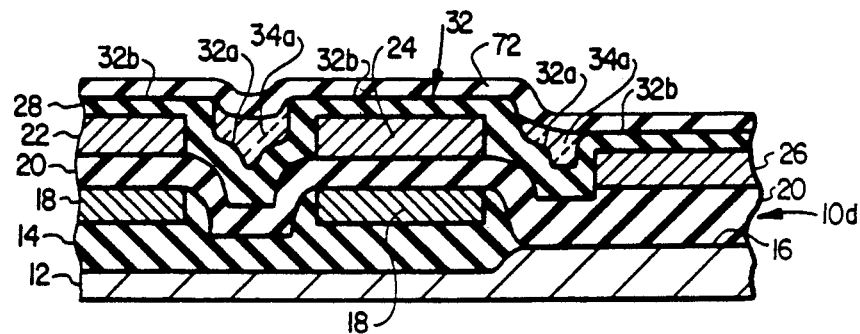

Specifically, after the deposited SOG coating 32 (FIG. 2) has been hot plate baked and nitrogen furnace cured as described above, the SOG coating 34 is back-etched in a suitable conventional manner, such as with the "Rainbow" back etching system manufactured by the Lam Corporation, to remove the SOG coating portions $34_b$, thereby leaving the SOG coating portions $34_a$ in place within the surface depressions $32_a$ as illustrated in FIG. 3. These remaining coating portions $34_a$, which have not yet been subjected to a final oxygen plasma curing process, fill in and generally level off the surface depressions $32_a$. As may readily be seen by comparing FIGS. 1 and 3, the general planarity of the top side of the substructure $10_c$ is substantially greater than that of the top side of the substructure $10_a$.

Figure 6:
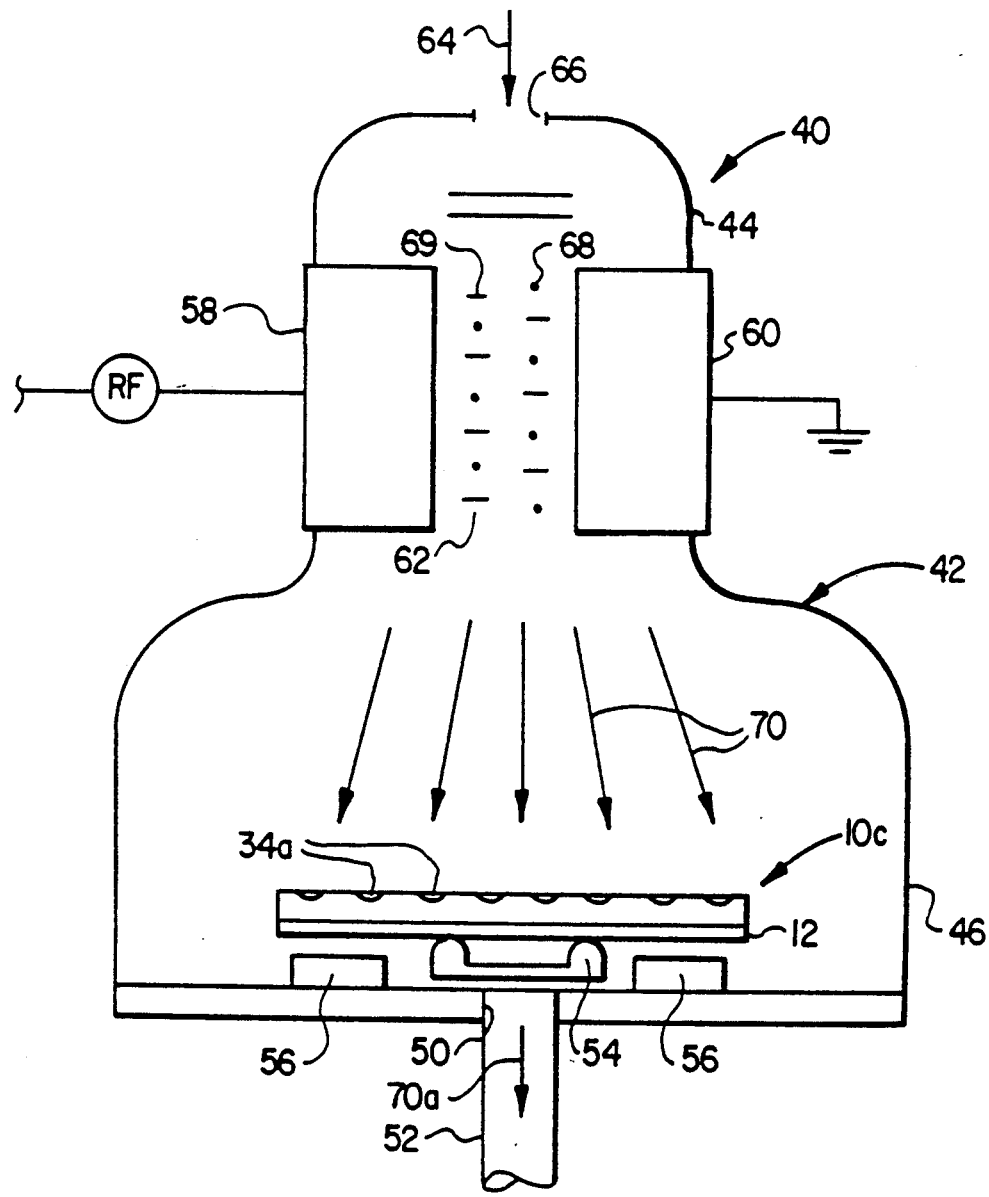
FIG. 6 is a schematic cross-sectional view through a representative downstream stripper type oxygen plasma generator being used in the surface planarization process of the present invention.

After the portions $34_b$ of the SOG coating 34 have been etched away, the remaining SOG coating portions $34_a$ are subjected to a final oxygen plasma curing process, preferably by positioning the circuit device substructure $10_c$ in a conventional downstream stripper type oxygen plasma generator 40 schematically depicted in FIG. 6. While other types of oxygen plasma generators could be utilized, the illustrated generator 40 is a Branson/IPC L3200 system and includes a generally bell-shaped housing 42 having a relatively narrow upper end portion 44, and a widened lower portion 46 across the bottom of which a quartz throttle plate 48 extends. Throttle plate 48 has a central opening 50 to which one end of a suitable vacuum hose 52 is connected, the opposite end of the hose 52 being connected to a vacuum pump (not shown). A quartz pedestal 54 supports the substructure $10_c$ within the housing 42 above the throttle plate opening 50, with the remaining SOG coating portions $34_a$ facing upwardly. Positioned beneath the substructure $10_c$ are heat lamps 56.

A 13.56 Mhz RF powered anode 58, and a complementary grounded cathode 60, are operatively supported on opposite sides of the upper housing portion 44 and form therebetween a flow space 62. During operation of the oxygen plasma generator 40, its associated vacuum pump is energized to create a flow of pure oxygen 64 (from a suitable source thereof) downwardly through a top end opening 66 in housing portion 44 and through the anode/cathode flow space 62.

The operation of the anode 58 and the cathode 60 generates, from the oxygen flow entering passage 62, neutral radical portions 68 and negatively charged ion portions 69. Ion portions 69 are short-lived compared to the neutral portions 68, and they react with the walls of the generator, and are subjected to other collisions, before reaching the wafer below.

The remaining neutral radical portions of the oxygen flow are drawn downwardly into the enlarged lower housing portion 46 in the form of oxygen plasma 70 which continuously impinges upon the remaining SOG coating portions $34_a$. During such impingement, the operation of the lamps 56 heats the coating portions $34_a$ to a self-biased control temperature (typically above 90° C.) to thereby effect the final curing of the coating portions $34_a$. After impingement with the coating portions $34_a$, the plasma 70 is withdrawn through the vacuum tube 52, in the form of partially deactivated oxygen plasma $70_a$ and is suitably vented from the system vacuum pump. This "elevated effected temperature" final curing process operates to stabilize the SOG coating portions $34_a$ by converting their siloxane structure to a silicate, quartz-like structure.

After this final oxygen plasma curing step is completed, the finally cured SOG coating portions $34_a$ are essentially crack-free, and the planarization of the top coating surface 32 (FIG. 3) is complete. A Novellus oxide coating 72 (FIG. 4), having a 3–4 kA thickness, is then deposited atop the now-planarized coating surface 32. Next, in a conventional manner, the final interconnect elements 30 (FIG. 5) are positioned atop the oxide coating 72, and predetermined portions $30_a$ of the elements 30 are extended downwardly through the insulative coatings 72 and 28 into operative electrical contact with appropriate ones of the insulation-encapsulated interconnect members such as the depicted interconnect members 22 and 26. Finally, the representative integrated circuit device 10 is completed by applying an insulative passivation coating 74 over the final interconnect elements 30, the coating 74 preferably comprising an inner layer $74_a$ of phosphorous silicate glass, and an outer layer $74_b$ of silicon nitrate.

In summary, the unique reversal in the present invention of the back etching and oxygen plasma final curing steps compared to conventional oxygen plasma curing-/back etching planarization processes advantageously avoids undesirable cracking in the remaining SOG coating portions $34_a$, Additionally, the performance of the back-etching step prior to the performance of the oxygen plasma final curing step provides another useful advantage. Specifically, when a chemical back-etching process is used, undesirable chemical residues are typically left on the back-etched surface. By performing the oxygen plasma curing process subsequent to the back-etching process, however, the oxygen plasma advantageously creates a chemical replacement of any fluorine remaining on the surface or incorporated into the SOG coating during the etch back process. This significantly facilitates the proper adherence of the coating layer $74_a$ to the underlying coating 72.

The foregoing detailed description is to be clearly understood as being given by way of illustration and example only, the spirit and scope of the present invention being limited solely by the appended claims.

What is claimed is:

1. In a method of planarizing a side surface of a partially completed integrated circuit device including the steps of coating the side surface with a spin-on glass material, subjecting the glass coating to a final curing process, and back etching the glass coating, the improvement wherein said step of back etching the glass coating is performed prior to said step of subjecting the glass coating to a final curing process.

2. The improvement of claim 1 wherein:
said step of subjecting the back etched glass coating to a final curing process includes the step of exposing the back etched glass coating to oxygen plasma.

3. The improvement of claim 2 wherein:
said step of subjecting the back etched glass coating to a final curing process is performed utilizing a downstream stripper type oxygen plasma generator.

4. An improved method of planarizing a side surface of a partially completed integrated circuit device, said side surface having a spaced apart series of depressed first sections, and a series of second sections disposed over imbedded electrically conductive portions of the device, said method comprising, in the sequence set forth below, the steps of:
depositing a spin-on glass coating on said first and second sections of said side surface;
partially curing the glass coating;
back etching the partially cured coating to remove the portions thereof disposed on said second sections of said side surface; and
utilizing an oxygen plasma process to finish-cure the partially cured coating portions left in said depressed first sections of said side surface after the completion of said back etching step.

5. The improved method of claim 4 wherein said step of utilizing an oxygen plasma process includes the steps of:

placing the partially completed, back etched integrated circuit device in the housing of a downstream stripper type oxygen plasma generator, and operating the oxygen plasma generator to finish-cure the coating portions left in said depressed first section after the completion of said back etching step.

6. A method of manufacturing an integrated circuit device comprising, in the sequence set forth below, the steps of:

providing an integrated circuit device substructure having a side surface with a spaced apart series of depressed first sections, and a series of second sections disposed over insulation-encapsulated first electrically conductive portions of the substructure;

depositing on said side surface a spin-on glass coating which covers said first and second sections of said side surface;

hot plate baking the glass coating;

nitrogen furnace curing the glass coating;

back etching the glass coating to remove the portions thereof previously deposited on said second sections of said side surface;

oxygen plasma curing the remaining glass coating portions;

depositing a first insulative coating on said side surface after said oxygen plasma curing step;

positioning on said first insulative coating electrically conductive circuitry which extends, at predetermined locations, through said first insulative coating and said second sections of said side surface into operative contact with said insulation-encapsulated first electrically conductive portions of the substructure; and covering said electrically conductive circuitry with a second insulative coating.

7. The method of claim 6 wherein:

said step of oxygen plasma curing the remaining glass coating portions is performed utilizing a downstream stripper type oxygen plasma generator.

* * * * *